US006090529A

United States Patent [19]

Gelbart

[11] Patent Number: 6,090,529

[45] Date of Patent: Jul. 18, 2000

[54] METHOD FOR PROCESSLESS FLEXOGRAPHIC PRINTING

[75] Inventor: Daniel Gelbart, Burnaby, Canada

[73] Assignee: Creo SRL, St. James, Barbados

[21] Appl. No.: 09/339,045

[22] Filed: Jun. 23, 1999

[51] Int. Cl.[7] ................................ G03F 7/00; G03F 7/26; G03F 1/14

[52] U.S. Cl. .......................... 430/306; 430/326; 430/330; 430/944; 430/271.1; 430/273.1

[58] Field of Search ..................................... 430/306, 326, 430/327, 330, 942, 945, 944, 271.1, 273.1, 906, 908

[56] References Cited

U.S. PATENT DOCUMENTS

| | | | |
|---|---|---|---|
| 4,077,922 | 3/1978 | Farrissey, Jr. et al. | 523/219 |
| 4,082,702 | 4/1978 | Harper | 523/219 |
| 4,281,039 | 7/1981 | Miura et al. | 428/159 |
| 5,215,859 | 6/1993 | Martens | 430/254 |
| 5,798,019 | 8/1998 | Cushner et al. | 156/425 |
| 5,894,799 | 4/1999 | Bart et al. | 101/376 |
| 5,942,312 | 8/1999 | Venkataraman et al. | 428/195 |

*Primary Examiner*—Janet Baxter
*Assistant Examiner*—Sin J. Lee
*Attorney, Agent, or Firm*—Oyen Wiggs Green & Mutala

[57] ABSTRACT

A method for directly imprinting a plate in flexographic, or 'raised image', printing uses a plate having an imprinting layer of a foam material. When an area of the imprinting layer is heated with a laser operating at an operating wavelength then a quantity of the foam material in the imprinting layer melts and re-solidifies. The re-solidified material has significantly less volume than the foam material had before it was melted. This leaves a recessed area in the printing surface. The method requires less energy than would be necessary to remove material from the printing surface by laser ablation. Furthermore, fewer noxious gases are produced by the method than are produced in ablative methods.

22 Claims, 2 Drawing Sheets

METHOD FOR PROCESSLESS FLEXOGRAPHIC PRINTING

CROSS-REFERENCE TO RELATED APPLICATIONS

This application is related to the subject matter of commonly owned patent application No. 09/298,956 entitled METHOD FOR PROCESSLESS FLEXOGRAPHIC PRINTING AND FLEXOGRAPHIC PRINTING PLATE filed on Apr. 26, 1999 which is incorporated herein by reference.

TECHNICAL FIELD

This invention relates to raised image printing on elastomeric surfaces, which is also known as 'flexographic' printing. In particular the invention relates to methods for directly creating a raised image on flexographic printing surfaces by localized heating to create recessed areas.

BACKGROUND OF THE INVENTION

Traditional flexographic printing methods prepare a printing plate (or a printing cylinder) by molding an elastomer, such as rubber, in a mold, or by photo-polymerizing a UV sensitive polymer. These methods are slow and expensive.

While it would be highly desirable to create flexographic printing plates in the form of a seamless sleeve it is generally impractical to do so because conventional flexographic printing surfaces, such as photo-polymer plates, typically require some chemical processing. Chemical processing is impractical for seamless sleeves and is much easier to perform on flat plates.

Another technique for creating a raised pattern on an elastomer is to directly cut the raised pattern using a $CO_2$ laser. The laser is controlled to ablate the elastomer in recessed areas and to leave the elastomer intact in raised areas. Direct laser processing is advantageous because it does not require any chemical processing or other intermediate process steps. As the data to be imaged is available in electronic form, it would appear that going directly from digital data to a $CO_2$ laser based engraver would be the most accurate and efficient way for making flexographic printing plates.

Conventional flexographic printing materials cannot be laser engraved quickly. This is because the laser must ablate a relatively thick layer (0.5 mm–2 mm) of elastomer. Further, typical elastomer materials as used in flexographic printing plates have ablation rates of only about 0.3 $mm^3$/w/sec. Thus a multi-KW laser is required to complete the task of engraving a typical flexographic plate in under one hour. Another difficulty with previous attempts at laser engraving of flexographic printing surfaces which use $CO_2$ lasers is that $CO_2$ lasers have a long wavelength (10.6 microns) which severely limits the resolution that can be achieved. The best resolution achievable with a laser is proportional to the wavelength of the laser.

Evans, U.S. Pat. No. 4,060,032 discloses a multi-layer flexographic printing plate which includes a metallic writing layer, a barrier layer, and a polymer substrate layered atop a metal backing. The polymer substrate is cellular so that its density is reduced in comparison to a solid polymer. The reduced density substrate can be laser ablated more quickly than a denser material. The Evans printing plate is developed in a two step process. First, a visible laser, such as an argon laser, is used to remove the metallic writing in portions of the plate which should be recessed to form a mask. Then an infrared laser, such as a $CO_2$ laser, is used to remove the barrier layer and a portion of the substrate layer in the areas exposed by the mask. The writing layer reflects the infrared laser beam in other areas.

The Evans methods and printing plates has three significant disadvantages. First the plates themselves are undesirably complicated to make as they have several layers including a top metallic mask layer. Second, there is a trend toward the use of thinner backings and thinner elastomeric layers in flexographic printing plates. The Evans methods can result in localized damage to thin backings if the $CO_2$ laser is allowed to ablate away all of the substrate layer in any location. A $CO_2$ laser sufficiently powerful to ablate the polymer layer in an Evans printing plate is capable of damaging thin backings. Thirdly, a $CO_2$ laser is typically incapable of achieving a resolution sufficient for making a printing plate. The Evans method is limited to creating plates in a two part process in which a high resolution mask is formed with a first laser and then the barrier layer and substrate are removed using a lower resolution $CO_2$ laser.

Barker, U.S. Pat. No. 3,832,948 discloses another method for making a printing plate. Like the method of Evans, the Barker method requires two separate laser ablation steps to create a printing plate.

Shuji, U.S. Pat. No. 4,943,467 discloses a plate for use in printing on corrugated board. The Shuji printing plate has a smooth skin layer disposed atop a foam layer. The smooth skin layer is quite thick, being in the range of 0.3 mm thick to 2.0 mm thick. The alleged advantage of the Shuji et al plate is that printing pressure can be reduced, thereby reducing damage to the corrugated board being imprinted. The Shuji et al plates are sculpted by mechanically cutting away the skin layer and the foam layer in recessed areas.

There remains a need for a method for direct laser imprinting flexographic printing plates which avoids the disadvantages set out above. There is particular need for a method for the direct laser imprinting of flexographic printing plates provided as seamless sleeves.

SUMMARY OF THE INVENTION

This invention provides methods for forming recessed regions in the printing surfaces of flexographic printing plates. No mask is required.

Accordingly, a first aspect of the invention provides a method for producing recessed areas in a surface of a flexographic printing plate. The method comprises providing a printing plate. The printing plate has an imprinting layer on a backing. The imprinting layer comprises a foam material which absorbs radiation of an operating wavelength. The method then focuses a beam of radiation of the operating wavelength on portions of the imprinting layer which are desired to be recessed. The invention reduces the volume of material in the imprinting layer at least in part by melting the foam material in the imprinting layer and allowing the melted material to shrink. While some material may be removed by ablation, the energy density of the focussed beam of radiation is selected to be lower than that required to remove all material from the imprinting layer by ablation. Upon absorbing radiation from the focussed beam, the foam material in the imprinting layer melts. The dwell time of the beam of radiation at each point on the imprinting layer is sufficient to allow viscous flow of melted foam material. The foam material solidifies on cooling. The cooled foam material occupies a fraction of the volume that it previously occupied. Preferably the foam material comprises a dye or pigment which absorbs radiation at the operating wavelength. For example, the foam may comprise finely dispersed particles of carbon.

Another aspect of the invention uses an operating wavelength of approximately one micron to achieve much higher resolution that would be possible with a $CO_2$ laser operating at 10.6 microns.

Further features and advantages of various embodiments of the invention are described below.

BRIEF DESCRIPTION OF THE DRAWINGS

In drawings which illustrate non-limiting embodiments of the invention.

DESCRIPTION

Figure 1:
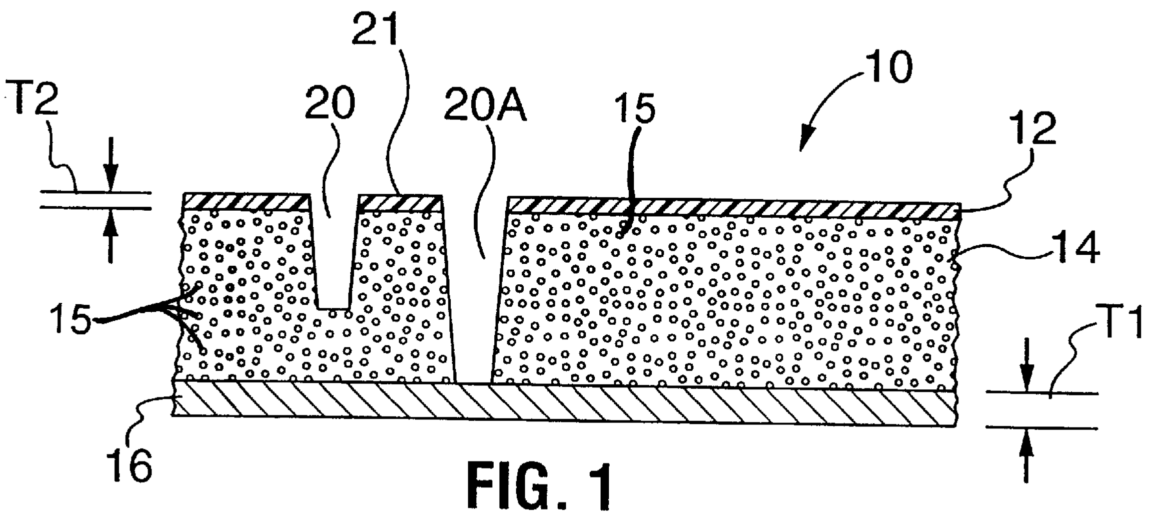
FIG. 1 shows a flexographic printing plate for use in the invention.

FIG. 1, shows a flexographic printing surface 10 according to the invention. Surface 10 may be planar, as shown, or may be curved to fit an appropriate printing device. Surface 10 may be provided, for example, as a flat plate, a curved plate, a sleeve or a seamless sleeve. Since the printing surface of this invention does not require chemical processing, printing surface 10 can be advantageously provided in the form of a seamless sleeve. As noted above, there are significant advantages to providing printing plates in the form of seamless sleeves.

Surface 10 comprises a thin elastomeric top layer 12, an intermediate layer 14 of closed cell elastomeric foam, and a backing 16. Backing 16 preferably comprises a dimensionally stable material. Backing 16 preferably has a thickness T1 of about 0.1 mm to about 0.3 mm if made of metal and a thickness T1 in the range of about 0.15 mm to about 1 mm if made of polyester. Preferred materials for backing 16 are polyester, aluminum and steel.

Top layer 12 may be made of the same elastomer as intermediate layer 14 or from a different elastomer. Top layer 12 is typically a neoprene, a thermoplastic elastomer or a polyurethane elastomer. The material of top layer 12 is selected to have good inking characteristics. Top layer 12 preferably has a thickness T2 in the range of about 0.02 mm to about 0.1 mm. No masking layer is required in or on surface 10.

Intermediate layer 14 may be a foamed version of the same elastomer used for top layer 12, or may be a different foam. The foam of intermediate layer 14 may be selected, for example, from the group consisting of polyurethanes, synthetic rubbers or acrylates. Intermediate layer 14 is preferably a foam material having the desired mechanical properties for printing, and which has a reasonably low heat capacity and a reasonably low heat of fusion. Intermediate layer 14 contains a large number of voids 15 which are typically gas filled. Voids 15 are preferably quite uniform in size and are preferably generally spherical.

Intermediate layer 14 may be called a "imprinting layer" because, in the method of this invention, recessed regions are formed in surface 10 when a laser operating at the operating wavelength acts on intermediate layer 14.

As most flat flexographic plates are manufactured by extrusion, the material of intermediate layer 14 is preferably a material which can be readily extruded during plate manufacturing. It is sometimes difficult to maintain exact control over thickness when extruding foams.

A preferred alternative to the use of a conventional extruded foam for intermediate layer 14 is to create intermediate layer 14 by extruding a mixture of an elastomer and a high concentration (typically in the range of 70% to 90% by volume) of plastic or glass micro-balloons. The micro-balloons form voids 15. Micro balloons have a size of about 50–100 microns and a wall thickness of a few microns, thus most of their volume is gas. Micro-balloons are readily available from Minnesota Mining and Manufacturing Corporation (3M Corporation) of Minneapolis Minn., as well as from Dow Corning and other suppliers. An intermediate layer 14 made with micro-balloons tends to have a consistency which is more uniform than that of most foams.

Intermediate layer 14 preferably includes an absorbant such as graphite or a suitable dye which strongly absorbs laser radiation of the wavelength at which backing 16 is either highly reflective or transparent (i.e. the operating wavelength).

It has been found that the invention can be effectively practised with the closed cell black polyurethane foam material available from Intertape Polymer Group of Charlotte, N.C.

Figure 2:
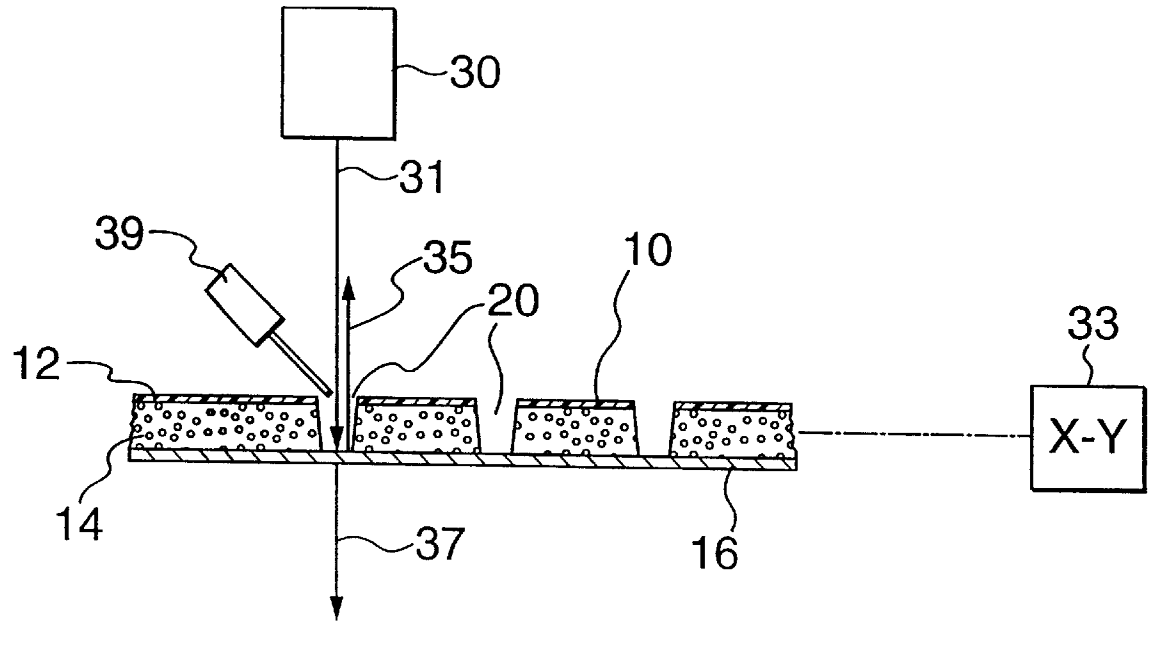
FIG. 2 is a schematic view of apparatus for practising the invention.

Surface 10 can be prepared for printing by direct laser writing on top layer 12 and intermediate layer 14 as shown in FIG. 2. A suitable laser 30 provides a beam 31 of coherent radiation at the operating wavelength. Laser 30 is preferably a laser diode operating at a wavelength in the range of about 700 nm to about 1200 nm. The time taken to imprint surface 10 may be reduced by providing an array of laser diodes which each imprint portions of surface 10. Laser beam 31 preferably has an operating wavelength sufficiently small to pattern surface 10 with a desired resolution without the use of a mask.

Laser beam 31 (FIG. 2) is absorbed by the material of top layer 12 and intermediate layer 14. It was previously though necessary to remove material from intermediate layer 14 by laser ablation in order to effectively create recessed areas in surface 10.

The inventor has discovered the surprising result that it is possible to create a printing surface imprinted with an image without the need to remove significant amounts of material from intermediate layer 14 by ablation. This may be done by controlling the intensity of laser beam 31 and the dwell time of laser beam 31 in each spot so that the laser power applied to each part of surface 10 is sufficient to cause localized melting of intermediate layer 14. The dwell time is long enough to allow viscous flow of the melted material. The laser intensity is insufficient to cause complete ablation of intermediate layer 14. The low intensity, long dwell time preferred by this invention makes non-laser sources a desireable source of radiation. For example, the radiation from an arc lamp or quartz-halogen incandescent lamp can be modulated by a light valve and applied to melt the foam. A scanning speed beam of radiation is preferably maintained in the range of 1 mm/sec to about 1 m/sec.

Because intermediate layer 14 comprises a foam material a piece of intermediate layer 14 has a much lower volume after it is melted and allowed to cool than it did prior to melting. When intermediate layer 14 melts, the gases in micro-balloons 15 are released. Intermediate layer 14 then contracts against backing 16 and solidifies as it cools to form a thin layer of solidified material 20A. The solidified material from intermediate layer 14 typically occupies about 10% of the volume occupied by the melted portion of intermediate layer 14 before it was melted. Thus, a recess 20A is formed in surface 10. The non-melted portions of surface 10 remain as raised features 21.

An advantage of the method of the invention over laser ablation is that the energy required to melt a volume of intermediate layer 14 is typically much less than the energy needed to remove the same volume of material by laser ablation. Furthermore, at least most of the material of layer 14 remains part of surface 10 instead of being vaporized as occurs in ablative processes. Therefore, the method of the invention produces less in the way of potentially noxious fumes than do laser ablation methods.

The energy need to form recessed areas 20 increases with the heat of fusion of the material being melted. As most of the volume of intermediate layer 14 is made up of air (or another gas, such as nitrogen), the density of intermediate layer 14 is low and the energy need to form recessed areas 20 is relatively low compared to laser ablation methods for forming similar recessed areas.

Laser beam 31 may be scanned over printing plate 10 in any suitable manner. FIG. 2 shows a system in which laser beam 31 is stationary while printing plate 10 is moved with a computer-controlled X-Y positioner 33. Laser beam 31 may be switched on and off as laser beam 31 is scanned over plate 10 so that recesses are formed in surface 10 by melting intermediate layer 14 only in selected areas.

Of course, all that is necessary is that laser beam 31 be moved relative to plate 10. Laser beam 31 could be scanned across the surface of plate 10 while plate 10 is held stationary or both plate 10 and laser beam 31 may be moved in a manner such that the laser beam 31 creates recessed areas 20 in desired locations on surface 10.

As noted above, a problem in the prior art is that laser damage may be caused to the thin backings used in modern flexographic printing plates. Such damage occurs when the backing is exposed to the laser beam as happens after all overlying material is ablated away. Small holes and nicks in the backing 16 can undesirably reduce the life of a printing plate 10. The method of this invention reduces the possibility of damage to backing 16 because material from intermediate layer 14 is not completely removed but is merely converted to another form in which the same material occupies less volume.

The fact that melting according to the invention is taking place can be verified by comparing weight loss to volume loss. Any volume loss greater than expected for a given weight loss indicates that some volume shrinkage has occurred by melting, which reduces volume but not weight. Where material is removed by pure ablation we have:

$$\frac{W_1 - W_2}{V_1 - V_2} = \frac{\Delta W}{\Delta V} = \varrho \tag{1}$$

where $W_1$ is the weight of the plate before imaging, $W_2$ is the weight of the plate after imaging, $V_1$ is the volume of the plate before imaging, $V_2$ is the volume of the plate after imaging and $\varrho$ is the density of the foam material removed by ablation. By contrast, where volume is lost purely by melting and solidification of foam material 14 then we have:

$$\frac{W_1 - W_2}{V_1 - V_2} = \frac{\Delta W}{\Delta V} = 0$$

because no weight is lost if material 14 is merely melted and allowed to solidify. Any value of $\varrho$ between zero and the nominal foam density indicates a combination of melting and ablation.

EXAMPLE 1

A flexographic printing plate was made by laminating a 1.0 mm thick closed cell black polyurethane foam (available from Intertape Polymer Group of Charlotte, N.C. to a backing of 0.17 mm thick polyester. The foam had a density of about 10% that of solid polyurethane. Recesses were created in the surface of the foam material by using the beam from a 1 Watt laser diode operating at a wavelength of 830 nm and focussed to a spot 100 microns in diameter. It was found that the foam absorbed the incident laser beam and the foam was melted but not ablated away. The cutting rate was about 10 mm/second. The slow speed (long dwell time) is required to allow the foam material to flow back against the backing after it melts. To achieve full ablation of the foam material under the same conditions would require a laser power on the order of 3 times to ten times greater. In practical commercial applications, a large number of laser diodes would be used simultaneously to reduce the time needed to create an imprinted printing surface since the scan speed must be kept low to permit the foam material to melt. After writing the sample, the sample was weighed and its weight loss was compared to its volume loss. It was found that the weight loss was less than would be expected if all of the foam material had been removed by ablation.

COMPARATIVE EXAMPLE 2

A flexographic printing plate was made by laminating a 1 mm thick closed cell black polyurethane foam (from Intertape Polymer Group Inc. of Charlotte, N.C.) to a backing of 0.1 mm thick cold-rolled steel sheet. The foam had a density of about 20% that of solid polyurethane. The foam was ablated using the beam from a 1 Watt laser diode operating at a wavelength of 830 nm and focussed to a spot 10 microns in diameter. It was found that the foam absorbed the incident laser beam and the foam was removed. The cutting rate was about 3 minutes per $cm^3$ of foam. Note that the 10 micron spot provides a power density about 100 times greater than the 100 micron spot of Example 1. This high power density is required to remove the intermediate layer by ablation.

As will be apparent to those skilled in the art in the light of the foregoing disclosure, many alterations and modifications are possible in the practice of this invention without departing from the spirit or scope thereof. For example, if lower quality printing is acceptable then top layer 12 may be omitted. Top layer 12 can be omitted where intermediate layer 14 has acceptable inking qualities and the voids in intermediate layer 14 are sufficiently small that they do not cause unacceptable edge roughness in the printed article.

Figure 3:
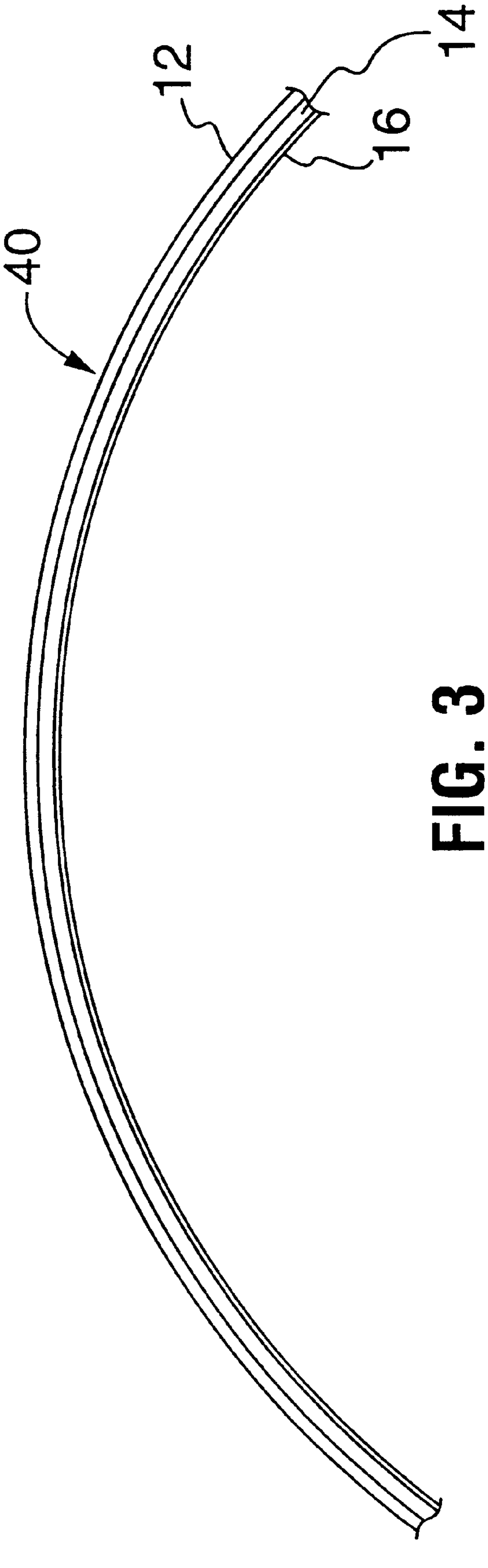
FIG. 3 is a partial section through a flexographic printing plate for use in the invention provided in the form of a seamless sleeve.

The invention is well adapted to imprinting printing plates which are provided in the form of seamless sleeves 40 as shown in FIG. 3. Seamless sleeves are highly desirable as printing plates, in part because a seamless sleeve cannot become distorted as it is mounted in a printing press in the same ways that flat plates can be come distorted when they are mounted onto cylindrical drums in a printing press. It is very difficult to provide conventional flexographic printing surfaces, such as photo-polymer plates, as seamless sleeves because such surfaces require chemical processing. Chemical processing is much easier to perform on plates provided in sheet form. The invention does not require any chemical processing.

Accordingly, the scope of the invention is to be construed in accordance with the substance defined by the following claims.

What is claimed is:

1. A method for producing recessed areas in a surface of a flexographic printing plate, the method comprising:

a) providing a printing surface comprising an imprinting layer of a foam material on a backing and an elastomeric top layer on the imprinting layer, the imprinting layer absorbing radiation of an operating wavelength;

b) directing a beam of radiation of the operating wavelength at the printing surface and thereby causing localized melting of a first quantity of the foam material in the imprinting layer;

c) allowing the first quantity of the foam material to solidify, thereby creating a recessed area in the printing surface.

2. The method of claim 1 wherein the plate is provided in the form of a seamless sleeve.

3. The method of claim 1 wherein a power density of the beam of radiation is maintained at a level insufficient to cause significant ablation of the material in the imprinting layer.

4. The method of claim 3 wherein a scanning speed of the beam of radiation is maintained in the range of 1 mm/sec to about 1 m/sec.

5. The method of claim 1 wherein the operating wavelength is in the range of about 700 nm to about 1200 nm.

6. A method for producing recessed areas in a surface of a flexographic printing plate, the method comprising:

a) providing a printing surface comprising an imprinting layer of a foam material on a backing, the imprinting layer absorbing radiation of an operating wavelength;

b) directing a beam of radiation of the operating wavelength at the printing surface and thereby causing localized melting of a first quantity of the foam material in the imprinting layer;

c) allowing the first quantity of the foam material to solidify, thereby creating a recessed area in the printing surface wherein a power density of the beam of radiation is maintained at a level insufficient to cause significant ablation of the material in the imprinting layer and the operating wavelength is about 830 nm.

7. The method of claim 1 wherein the imprinting layer comprises an elastomeric foam.

8. The method of claim 7 wherein the foam comprises a foam of an elastomer selected from the group consisting of polyurethanes, synthetic rubbers and acrylates.

9. The method of claim 7 wherein the foam comprises a dye which absorbs radiation at the operating wavelength.

10. The method of claim 7 wherein the foam comprises a pigment which absorbs radiation at the operating wavelength.

11. The method of claim 7 wherein the imprinting layer comprises finely dispersed carbon particles which absorb radiation at the operating wavelength.

12. The method of claim 1 wherein the top layer has a thickness in the range of about 0.02 mm to about 0.1 mm.

13. The method of claim 1 wherein the top layer has a chemical composition different from that of the imprinting layer.

14. A method for producing recessed areas in a surface of a flexographic printing plate, the method comprising:

a) providing a printing surface comprising an imprinting layer of a foam material on a backing and a top layer having a thickness in the range of about 0.02 mm to about 0.1 mm, the imprinting layer absorbing radiation of an operating wavelength;

b) directing a beam of radiation of the operating wavelength at the printing surface and thereby causing localized melting of a first quantity of the foam material in the imprinting layer;

c) allowing the first quantity of the foam material to solidify, thereby creating a recessed area in the printing surface wherein the top layer has a chemical composition the same as that of the imprinting layer, the imprinting layer contains voids and the top layer is substantially free of voids.

15. The method of claim 1 wherein providing the printing surface comprises providing an imprinting layer comprising a foam material, the foam material comprising an elastomer and 70% to 90% by volume of micro-balloons dispersed throughout the elastomer.

16. The method of claim 15 wherein the micro-balloons have diameters in the range of 50 microns to 100 microns.

17. A method for producing recessed areas in a surface of a flexographic printing plate, the method comprising:

a) providing a printing surface comprising an imprinting layer of a foam material on a backing, the imprinting layer absorbing radiation of an operating wavelength;

b) directing a beam of radiation of the operating wavelength at a the printing surface and thereby heating a volume of the foam material;

c) continuing to direct the beam of radiation at the printing surface to achieve a reduction in volume of the volume of foam material, the volume reduction at least partly caused by melting and shrinking of the foam material; and, d) allowing the melted foam material to solidify, thereby creating a recessed area in the printing surface wherein said beam of radiation is generated by a combination of an arc lamp and a light valve.

18. The method of claim 17 wherein $$\frac{W_1 - W_2}{V_1 - V_2} < \varrho$$

where $W_1$ is the weight of the printing surface provided in step (a), $W_2$ is the weight of the printing surface after step (d), $V_1$ is the volume of the printing surface provided in step (a), $V_2$ is the volume of the printing surface after step (d) and $\varrho$ is the density of the foam material.

19. A method for producing recessed areas in a surface of a flexographic printing plate, the method comprising:

a) providing a printing surface comprising an imprinting layer of a foam material on a backing, the imprinting layer absorbing radiation of an operating wavelength;

b) directing a beam of radiation of the operating wavelength at a the printing surface and thereby heating a volume of the foam material;

c) continuing to direct the beam of radiation at the printing surface to achieve a reduction in volume of the volume of foam material, the volume reduction at least partly caused by melting and shrinking of the foam material; and, d) allowing the melted foam material to solidify, thereby creating a recessed area in the printing surface wherein said beam of radiation is generated by a combination of an incandescent lamp and a light valve.

20. The method of claim 19 wherein $$\frac{W_1 - W_2}{V_1 - V_2} < \varrho$$

where $W_1$ is the weight of the printing surface provided in step (a), $W_2$ is the weight of the printing surface after step (d), $V_1$ is the volume of the printing surface provided in step (a), $V_2$ is the volume of the printing surface after step (d) and $\varrho$ is the density of the foam material.

21. A method for producing recessed areas in a surface of a flexographic printing plate, the method comprising:

a) providing a printing surface comprising an imprinting layer of a foam material on a backing, the imprinting layer absorbing radiation of an operating wavelength the imprinting layer comprising a foam material, the foam material comprising an elastomer and 70% to 90% by volume of micro-balloons dispersed throughout the elastomer;

b) directing a beam of radiation of the operating wavelength at the printing surface and thereby causing localized melting of a first quantity of the foam material in the imprinting layer;

c) allowing the first quantity of the foam material to solidify, thereby creating a recessed area in the printing surface.

22. The method of claim 21 wherein the micro-balloons have diameters in the range of 50 microns to 100 microns.

* * * * *